United States Patent
Chui et al.

(10) Patent No.: US 7,435,987 B1
(45) Date of Patent: Oct. 14, 2008

(54) FORMING A TYPE I HETEROSTRUCTURE IN A GROUP IV SEMICONDUCTOR

(75) Inventors: Chi On Chui, Los Angeles, CA (US); Prashant Majhi, Austin, TX (US); Wilman Tsai, Saratoga, CA (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 11/728,890

(22) Filed: Mar. 27, 2007

(51) Int. Cl.
H01L 31/0328 (2006.01)

(52) U.S. Cl. .................. 257/14; 257/19; 257/194; 257/E29.069; 257/E29.072

(58) Field of Classification Search .................. 257/14, 257/E29.069
See application file for complete search history.

(56) References Cited

U.S. PATENT DOCUMENTS

| | | | | |
|---|---|---|---|---|
| 6,891,869 B2 * | 5/2005 | Augusto | | 372/43.01 |
| 2006/0148182 A1 | 7/2006 | Datta et al. | | 438/289 |
| 2006/0237801 A1 | 10/2006 | Kavalieros et al. | | 257/388 |

OTHER PUBLICATIONS

U.S. Appl. No. 11/529,963, Filed Sep. 29, 2006, entitled, "Methods For Uniform Doping Of Non-Planar Transistor Structures," by Brian Doyle, et al.

U.S. Appl. No. 11/450,745, Filed Jun. 9, 2006, entitled, "Strain-Inducing Semiconductor Regions," by Suman Datta, et al.

Jack Kavalieros, et al., "Tri-Gate Transistor Architecture With High-k Gate Dielectrics, Metal Gates and Strain Engineering," Jun. 2006, pp. 1-2.

Yu-Hsuan Kuo, et al., "Strong Quantum-Confined Stark Effect In Germanium Quantum-Well Structures On Silicon," Oct. 2005, pp. 1334-1336.

Minjoo L. Lee, et al., "Strained Si, SiGe, And Ge Channels For High-Mobility Metal-Oxide-Semiconductor Field-Effect Transistors," Dec. 2004, pp. 1-27.

Minjoo L. Lee, et al., "Strained Si/strained Ge Dual-Channel Heterostructures On Relaxed $Si_{0.5}Ge_{0.5}$ for Symmetric Mobility p-Type and n-Type Metal-Oxide-Semiconductor Field-Effect Transistors," Sep. 2003, pp. 4202-4204.

* cited by examiner

*Primary Examiner*—Tu-Tu V Ho
(74) *Attorney, Agent, or Firm*—Trop, Pruner & Hu, P.C.

(57) ABSTRACT

In one embodiment, the present invention includes a method for forming a transistor that includes forming a first buffer layer of silicon germanium tin (SiGe(Sn)) on a silicon (Si) substrate, forming a barrier layer on the first buffer layer, the barrier layer comprising silicon germanium ($Si_{1-x}Ge_x$), and forming a quantum well (QW) layer on the barrier layer including a lower QW barrier layer formed of silicon germanium carbon ($Si_{1-y}Ge_y(C)$), a strained QW channel layer formed of germanium on the lower QW layer, and an upper QW barrier layer on the strained QW channel layer formed of $Si_{1-z}Ge_z(C)$. Other embodiments are described and claimed.

14 Claims, 3 Drawing Sheets

FORMING A TYPE I HETEROSTRUCTURE IN A GROUP IV SEMICONDUCTOR

BACKGROUND

A variety of electronic and optoelectronic devices can be enabled by developing thin film relaxed lattice constant III-V semiconductors on elemental silicon (Si) substrates. Surface layers capable of achieving the performance advantages of III-V materials may host a variety of high performance electronic devices such as complementary metal oxide semiconductor (CMOS) and quantum well (QW) transistors fabricated from extreme high mobility materials such as, but not limited to, indium antimonide (InSb), indium gallium arsenide (InGaAs) and indium arsenide (InAs).

Other transistors are formed using Group IV materials such as germanium (Ge). However, such transistors have poor n-channel properties, i.e., surface channel properties are poor due to high interface state density near conduction band edges and these devices are unable to form quantum wells. Furthermore, such Ge transistors typically cannot be integrated into complementary-channel metal oxide semiconductor field effect transistors (MOSFETs) using standard complementary CMOS process flows.

DETAILED DESCRIPTION

In various embodiments, Type I heterostructure channels may be formed in Group IV materials to form CMOS devices. While the scope of the present invention is not limited in this regard, in some implementations a channel may be formed including a Group IV material such as germanium (Ge). For example, in some embodiments a silicon germanium carbon (SiGe(C))-based alloy may be used in a channel region of MOSFET devices. Note that the element in the internal parenthesis (i.e., carbon) is optional. The higher bandgap of SiGe (C) and especially positive band offsets for both conduction and valence band edges allows formation of buried channel QWs for both n-channel MOSFETs (NMOS) and p-channel MOSFETs (PMOS). Accordingly, conventional CMOS processing to complete a gate stack may be implemented. Furthermore, presence of a SiGe(C) layer may also provide higher thermal stability for a stack and minimized dopant diffusion for ultra-shallow junctions.

Accordingly, in various embodiments nMOSFETs and pMOSFETs may be formed on common Ge channels. Such devices may be realized as transport in a high mobility channel may be possible with modulation doping. Furthermore, reduced short channel effect (SCE) within a QW may be realized by raising the bandgap and quantum confinement. Furthermore, a sub-band may be populated with lower effective mass. Still further, n-type dopant diffusions may be reduced to form ultra-shallow junctions and furthermore, compressive strain may be induced in a Ge layer to increase effective electron mass, which improves PMOS performance and lowers electron and hole mobility mismatch.

Figure 1:
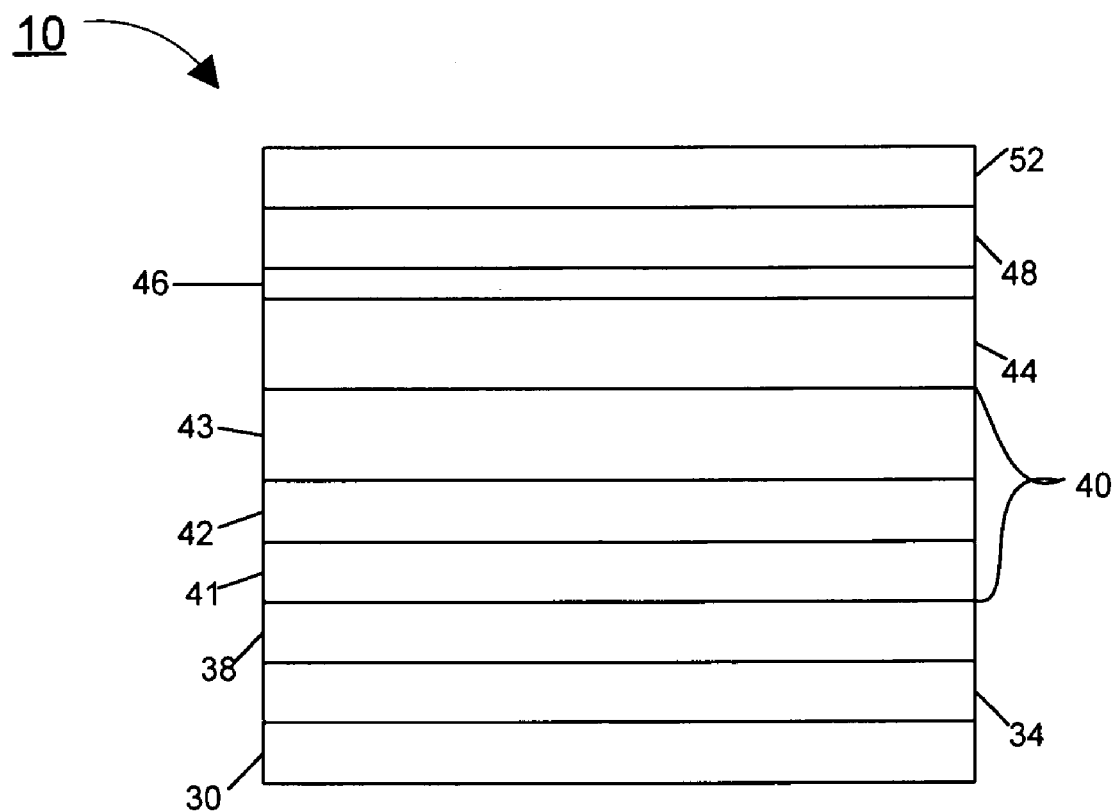
FIG. 1 is a cross section view of a device structure in accordance with an embodiment of the present invention.

Referring now to FIG. 1, shown is a cross section view of a device structure 10 in accordance with an embodiment of the present invention. As shown in FIG. 1, structure 10 may be used to form NMOS or PMOS devices on a substrate 30. In various embodiments, substrate 30 may be a high resistivity n or p-type (100) off-oriented Si substrate, although the scope of the present invention is not limited in this regard.

As shown in FIG. 1, next a buffer layer 34 may be formed on substrate 30. In various embodiments, buffer layer 34 may be a graded silicon germanium tin (SiGe(Sn)) layer. Note again that the element in the internal parenthesis (i.e., tin) is optional. Buffer layer 34 may be formed via an ultra-high vacuum chemical vapor deposition (UHVCVD) or reduced pressure chemical vapor deposition (RPCVD), or another such process. In some embodiments, buffer layer 34 may be formed in a graded manner with increasing Ge concentration from its interface with underlying substrate 30. As an example, the buffer ramp rates may be in the range of approximately 10-20% per micron of SiGe growth. In this way, increasing Ge concentration is realized such that at a top portion, the layer may have a Ge concentration of at least approximately 80%, in some embodiments. Alternately, buffer layer 34 may be achieved by wafer bonding or an equivalent process. In still other embodiments, buffer layer 34 may be a buried oxide. In some embodiments, the thickness of buffer layer 34 may vary depending on deposition method. For grading it may be 10 microns; for bonding onto a buried oxide, the oxide could be of any thickness (e.g., 100-1000 angstroms (Å)).

A lower barrier layer 38 may be formed on buffer layer 34. Lower barrier layer 38 may be formed of a higher bandgap material than a quantum well layer to be formed thereon. Lower barrier layer 38 may be formed of silicon germanium ($Si_{1-x}Ge_x$), in one embodiment. Lower barrier layer 38 may be of sufficient thickness to provide a potential barrier to charge carriers in the transistor stack. In one embodiment, lower barrier layer 38 may have a thickness of between approximately 100 Å-250 Å. In other embodiments, lower barrier layer 38 may be between approximately 2-5 microns (µm).

Referring still to FIG. 1, a quantum well layer 40 may be formed over lower barrier layer 38. Quantum well layer 40 may be formed of multiple materials having both smaller and larger bandgaps than that of lower barrier layer 38. In one embodiment, quantum well layer 40 may be formed of a lower QW barrier layer 41, a QW channel layer 42, and an upper QW barrier layer 43. In one embodiment, lower QW barrier layer 41 may be formed by a pseudomorphic growth of a tensile strained silicon germanium carbon ($Si_{1-y}Ge_y(C)$) layer, where the germanium content (y) may be lower than the germanium content (x) of barrier layer 38. Above this lower QW barrier layer 41, a compressive strained germanium layer may be pseudomorphically grown to form QW channel layer 42. In turn, over QW channel layer 42 an upper QW barrier layer 43, which may be formed of silicon germanium carbon ($Si_{1-y}Ge_y(C)$), whose Ge content (z), may be equal to y or lower, may be formed. Quantum well layer 40 may be of sufficient thickness to provide adequate channel conductance. In some embodiments, quantum well layer 40 may be between approximately 10-50 nanometers (nm). Quantum well layer 40 may provide high electron mobility and velocity for NMOS devices, and also may provide high hole mobility and velocity for PMOS devices, both compared to a Si-based device. In other embodiments, a quantum well in accordance with an embodiment may be formed on a high Ge content silicon germanium on insulator substrate. Yet in other embodiments a quantum well may be grown on a strain compensated silicon germanium tin allow buffer to favor the tensile strain introduction to the QW barrier layers.

As further shown in FIG. 1, a spacer layer 44 optionally may be formed over quantum well layer 40 to provide tensile strain. Spacer layer 44 may be a $Si_{1-x}Ge_x$ spacer layer. Spacer layer 44 may provide for carrier confinement and remote ion scattering reduction as well as reduced interaction between a doping layer and a two dimensional electron gas (2DEG) formed inside the channel (i.e., the channel of quantum well layer 40). In various embodiments, spacer layer 44 may be approximately 20 Å to 30 Å thick.

A gate stack may then be formed above this spacer layer 44. A doping layer may be formed over spacer layer 44. Doping layer 46 may be delta-doped, modulation doped and/or combinations thereof. For example, in one embodiment doping layer 46 may be a modulation delta-doped layer having a thickness of approximately 3 Å-5 Å. For an NMOS device, doping may be implemented using arsenic (As) or phosphorus (P) impurities. As for a PMOS device, doping may be boron (B).

Referring still to FIG. 1, an upper barrier layer 48 may be formed over doping layer 46 to complete the device stack or layer. In one embodiment, barrier layer 48 may be an $Si_{1-x}Ge_x$ barrier layer. Barrier layer 48 may have a thickness of between approximately 50 Å-500 Å, and may be a Schottky barrier layer for gate control.

As further shown in FIG. 1, a contact layer 52 may be present to act as a contact layer to provide source and drain contacts with low contact resistance and may be formed of $Si_{1-x}Ge_x$, in various embodiments. For an NMOS device, contact layer 52 may be n+doped, while for a PMOS device, contact layer 52 may be p+doped. Contact layer 52 may be between approximately 30 Å-300 Å thick.

While not shown in FIG. 1, a fully completed device may further include source and drain electrodes. Furthermore, a dielectric material may be formed on barrier layer 48 over which a gate electrode may be formed. Note that a gate recess etch may be performed within upper barrier layer 48 to form a gate recess on which the dielectric layer and gate electrode may be formed. Thus a Schottky junction may be formed through which a gate electrode may control quantum well layer 40.

Accordingly, in various embodiments devices may be formed using a high electron mobility material to form high electron mobility transistors (HEMTs) or high hole mobility transistors (HHMTs) having high speed and low power consumption. Such devices may have dimensions less than approximately 50 nm with a switching frequency of approximately 562 gigahertz (GHz). Such devices may be able to operate at between approximately 0.5-1.0 volts without significant reduction of drive current. Furthermore, embodiments may provide lower gate delay at a gate length than a silicon based device.

Figure 2:
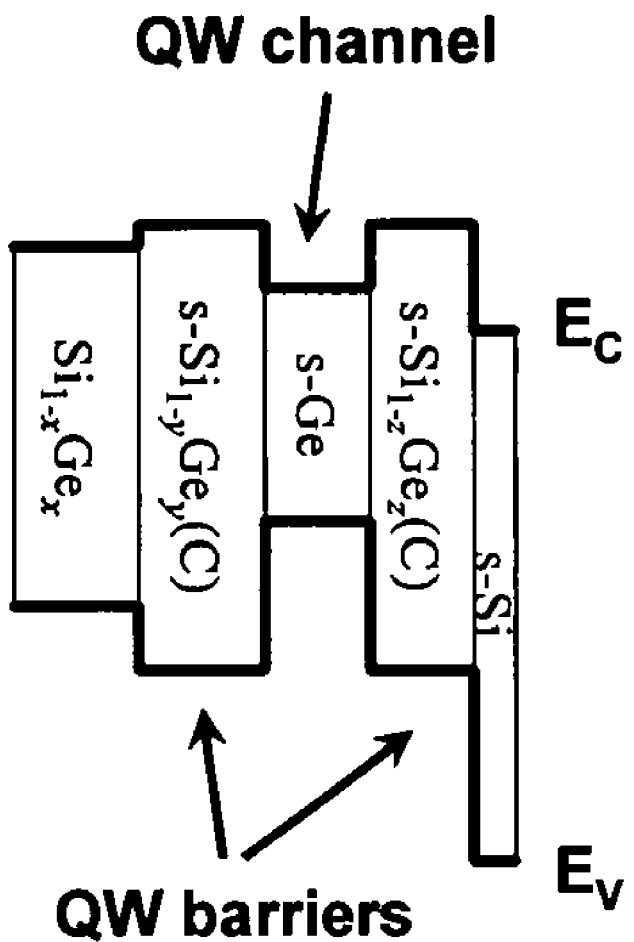
FIG. 2 is a band diagram of a structure in accordance with an embodiment of the present invention.

Referring now to FIG. 2, shown is a band diagram of a structure in accordance with an embodiment of the present invention. As shown in FIG. 2, the band diagram illustrates, via the top line a conduction band (i.e., $E_C$) and via the lower line a valence band (i.e., $E_V$). Beginning at the left-hand side of FIG. 2, the lower barrier layer, which may be silicon germanium (i.e., $S_{1-x}Ge_x$) may be formed. Over this layer, a lower QW barrier layer, which may be formed of tensile strain silicon germanium carbon ($Si_{1-y}Ge_y(C)$) may be formed. As shown, this barrier layer has a higher bandgap than the buffer layer over which it is formed. In turn, the compressive strain germanium QW channel layer may be formed which has a smaller bandgap than both the buffer and barrier layers. Over the QW channel layer, an upper tensile strained silicon germanium carbon ($Si_{1-z}Ge_z(C)$) barrier layer may be formed that may, in some embodiments have the same bandgap as the lower QW barrier layer. Then, as shown in FIG. 2, an optional tensile strained silicon layer may be formed over the upper QW barrier layer which has a higher bandgap than the other layers.

Figure 3:
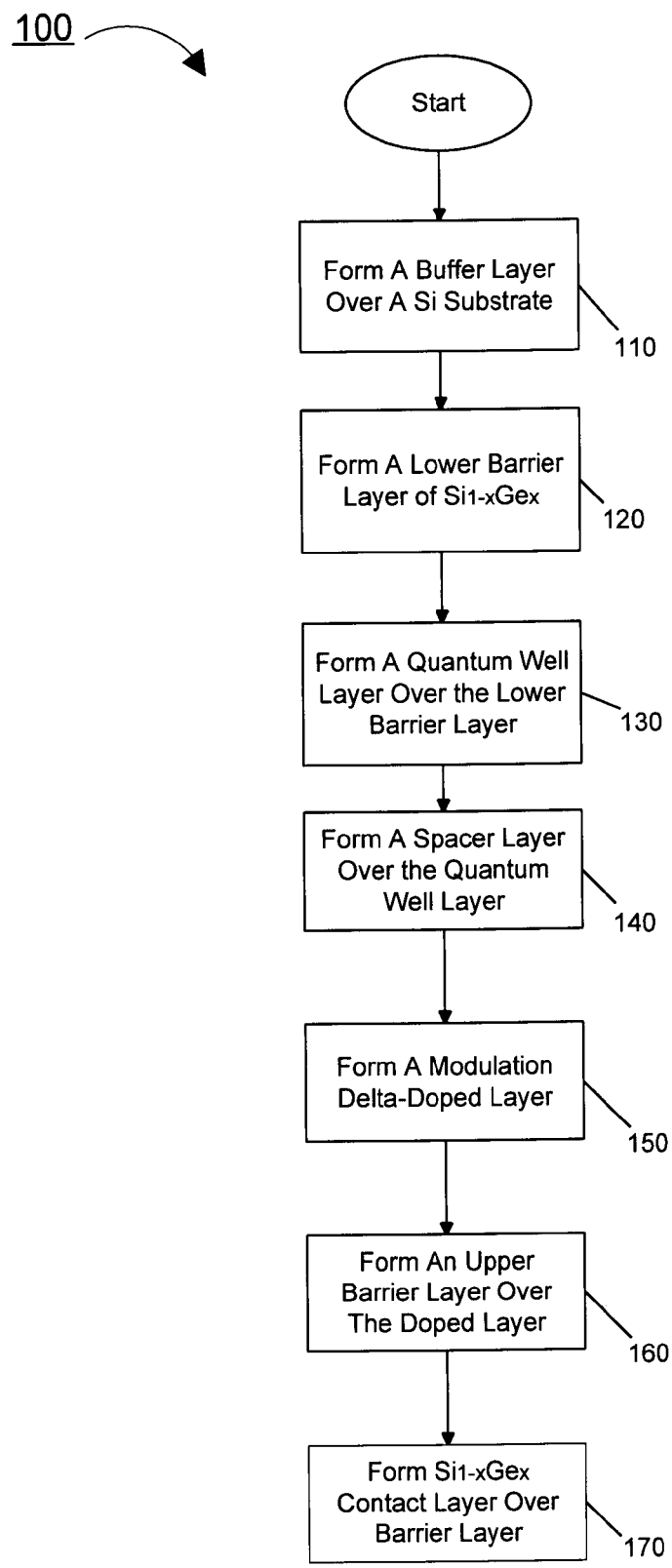
FIG. 3 is a flow diagram of a method in accordance with an embodiment of the present invention.

Referring now to FIG. 3, shown is a flow diagram of a method in accordance with an embodiment of the present invention. As shown in FIG. 3, method 100 may begin by forming a buffer layer over a Si substrate (block 110). As described above, in some embodiments the buffer layer may be graded SiGe(Sn). Next, a lower barrier layer, e.g., of $Si_{1-x}Ge_x$, may be formed (block 120). Next, a QW layer, which may be formed of a tensile strain $Si_{1-y}Ge_y(C)$ lower QW barrier layer, a compressive strain Ge QW channel layer, and a tensile strain $Si_{1-z}Ge_z(C)$ upper QW barrier layer, is formed over the lower barrier layer (block 130). Then a spacer layer may be formed over the quantum well (QW) channel layer (block 140). Next, a modulation delta-doped layer may be formed (block 150). To complete the device stack, an upper barrier layer may be formed over the doped layer (block 160). Then a contact layer of $Si_{1-x}Ge_x$ may be formed over the barrier layer (block 170). Of course, from this contact layer, source and drains of a device may be formed, and further a gate electrode may be formed on a dielectric layer formed over the contact layer. While shown with this particular implementation in the embodiment of FIG. 3, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a silicon (Si) substrate;
   a first buffer layer formed of silicon germanium tin (SiGe(Sn)) on the Si substrate;
   a barrier layer on the first buffer layer, the barrier layer comprising silicon germanium ($Si_{1-x}Ge_x$); and
   a quantum well (QW) layer including:
      a lower QW barrier layer on the barrier layer, the lower QW barrier layer formed of silicon germanium carbon ($Si_{1-y}Ge_y(C)$);
      a strained QW channel layer formed of germanium on the lower QW layer; and
      an upper QW barrier layer on the strained QW channel layer formed of $Si_{1-z}Ge_z(C)$.

2. The apparatus of claim 1, wherein the first buffer layer is formed of $Si_{1-x}Ge_x$ at an interface with the Si substrate and is graded with increasing concentration of germanium (Ge) to obtain a Ge concentration of at least approximately 80%.

3. The apparatus of claim 2, wherein x is greater than y.

4. The apparatus of claim 3, wherein z is less than or equal to y.

5. The apparatus of claim 2, wherein the lower and upper QW barrier layers are tensile strained.

6. The apparatus of claim 5, where the strained QW channel layer is compressive strained.

7. The apparatus of claim 2, further comprising:
   a spacer layer formed over the quantum well layer;
   a delta-doped layer formed over the spacer layer; and
   an upper barrier layer formed over the delta-doped layer, the upper barrier layer formed of $Si_{1-x}Ge_x$.

8. The apparatus of claim 7, wherein the apparatus comprises a high electron mobility transistor (HEMT) or high hole mobility transistor (HHMT), wherein the quantum well layer comprises a channel of the HEMT or HHMT.

9. A method comprising:
  forming a first buffer layer of silicon germanium tin (SiGe(Sn)) on a silicon (Si) substrate;
  forming a barrier layer on the first buffer layer, the barrier layer comprising silicon germanium ($Si_{1-x}Ge_x$); and
  forming a quantum well (QW) layer on the barrier layer including a lower QW barrier layer formed of silicon germanium carbon ($Si_{1-y}Ge_y(C)$), a strained QW channel layer formed of germanium on the lower QW layer, and an upper QW barrier layer on the strained QW channel layer formed of $Si_{1-z}Ge_z(C)$.

10. The method of claim 9, wherein the first buffer layer is formed of $Si_{1-x}Ge_x$ at an interface with the Si substrate and is graded with increasing concentration of germanium (Ge) to obtain a Ge concentration of at least approximately 80%.

11. The method of claim 10, wherein x is greater than y and z is less than or equal to y.

12. The method of claim 11, wherein the lower and upper QW barrier layers are tensile strained.

13. The method of claim 12, wherein the strained QW channel layer is compressive strained.

14. The method of claim 13, further comprising forming a high electron mobility transistor (HEMT) or a high hole mobility transistor (HHMT), wherein the quantum well layer comprises a channel of the HEMT or HHMT.

* * * * *